US009928954B2

(12) United States Patent
Cuoco

(10) Patent No.: US 9,928,954 B2
(45) Date of Patent: Mar. 27, 2018

(54) TRANSFORMER

(71) Applicant: Ampleon Netherlands B.V., Nijmegen (NL)

(72) Inventor: Vittorio Cuoco, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 192 days.

(21) Appl. No.: 14/821,627

(22) Filed: Aug. 7, 2015

(65) Prior Publication Data

US 2016/0064140 A1    Mar. 3, 2016

(30) Foreign Application Priority Data

Aug. 28, 2014 (EP) .................................... 14182574

(51) Int. Cl.
| | |
|---|---|
| *H01F 5/00* | (2006.01) |
| *H01F 27/29* | (2006.01) |
| *H01F 27/28* | (2006.01) |
| *H01L 23/66* | (2006.01) |
| *H01F 41/02* | (2006.01) |
| *H03F 3/189* | (2006.01) |
| *H03F 3/20* | (2006.01) |
| *H03H 7/01* | (2006.01) |
| *H01L 23/00* | (2006.01) |

(52) U.S. Cl.
CPC .............. *H01F 27/29* (2013.01); *H01F 5/00* (2013.01); *H01F 27/2804* (2013.01); *H01F 27/2823* (2013.01); *H01F 41/02* (2013.01); *H01L 23/66* (2013.01); *H01L 24/06* (2013.01); *H03F 3/189* (2013.01); *H03F 3/20* (2013.01); *H03H 7/0115* (2013.01); *H01F 2027/2814* (2013.01); *H01L 2224/05554* (2013.01); *H01L 2224/4813* (2013.01); *H01L 2224/4909* (2013.01); *H01L 2924/00014* (2013.01); *H03F 2200/451* (2013.01)

(58) Field of Classification Search
CPC ........................ H01F 5/00; H01F 27/00–27/36
USPC ........................................... 336/65, 200, 232
See application file for complete search history.

(56) References Cited

U.S. PATENT DOCUMENTS

| | | | | |
|---|---|---|---|---|
| 4,103,267 | A * | 7/1978 | Olschewski | ........ H01F 27/2804 29/606 |
| 5,543,773 | A * | 8/1996 | Evans | ................. H01F 27/2804 336/183 |
| 6,775,901 | B1 * | 8/2004 | Lee | ..................... H01F 17/0033 29/602.1 |
| 6,998,952 | B2 * | 2/2006 | Zhou | ................... H01F 17/0033 29/602.1 |
| 6,998,953 | B2 * | 2/2006 | Yeo | ..................... H01L 23/5227 336/200 |
| 8,012,868 | B1 | 9/2011 | Naval et al. | |
| 2003/0122219 | A1 | 7/2003 | Park | |
| 2007/0128821 | A1 | 6/2007 | Lee et al. | |

(Continued)

FOREIGN PATENT DOCUMENTS

EP            2 461 335 A1    6/2012

*Primary Examiner* — Tuyen Nguyen
(74) *Attorney, Agent, or Firm* — McDonnell Boehnen Hulbert & Berghoff LLP

(57) ABSTRACT

A bond-wire transformer for an RF device is described. The primary and secondary circuits of the bond-wire transformer are formed using loops formed with a pair of normal profile and low profile bond-wires. This results in improved efficiency and higher power operation.

15 Claims, 11 Drawing Sheets

(56) References Cited

U.S. PATENT DOCUMENTS

2012/0061816 A1    3/2012  Song et al.
2015/0235941 A1*   8/2015  Nishijima ............ H01L 23/528
                                                         333/17.3

* cited by examiner

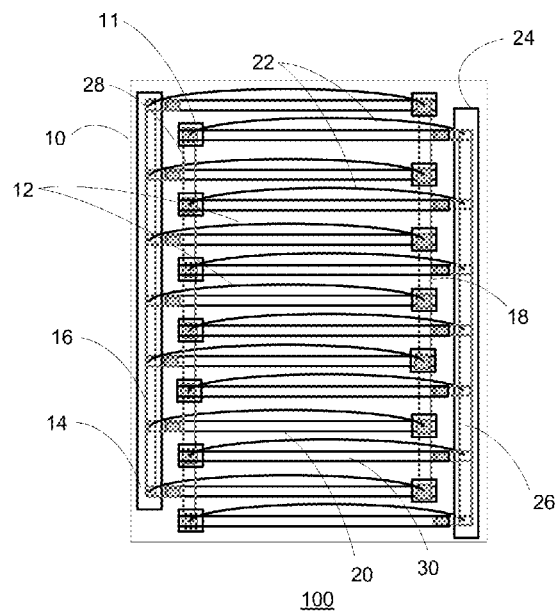
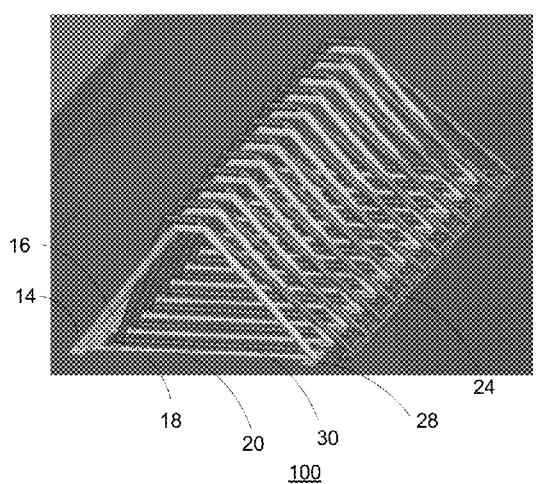
FIG 1a
FIG 1b
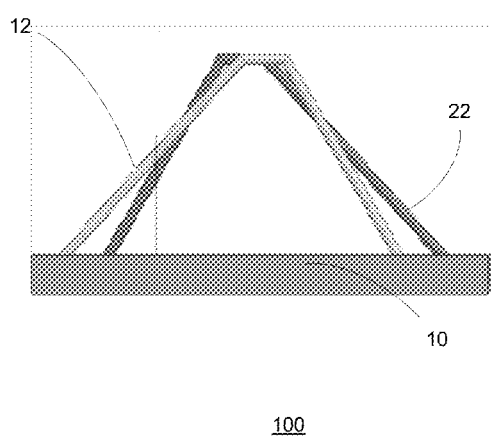
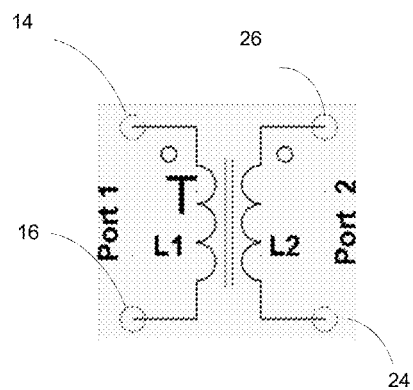
FIG 1c
FIG 1d

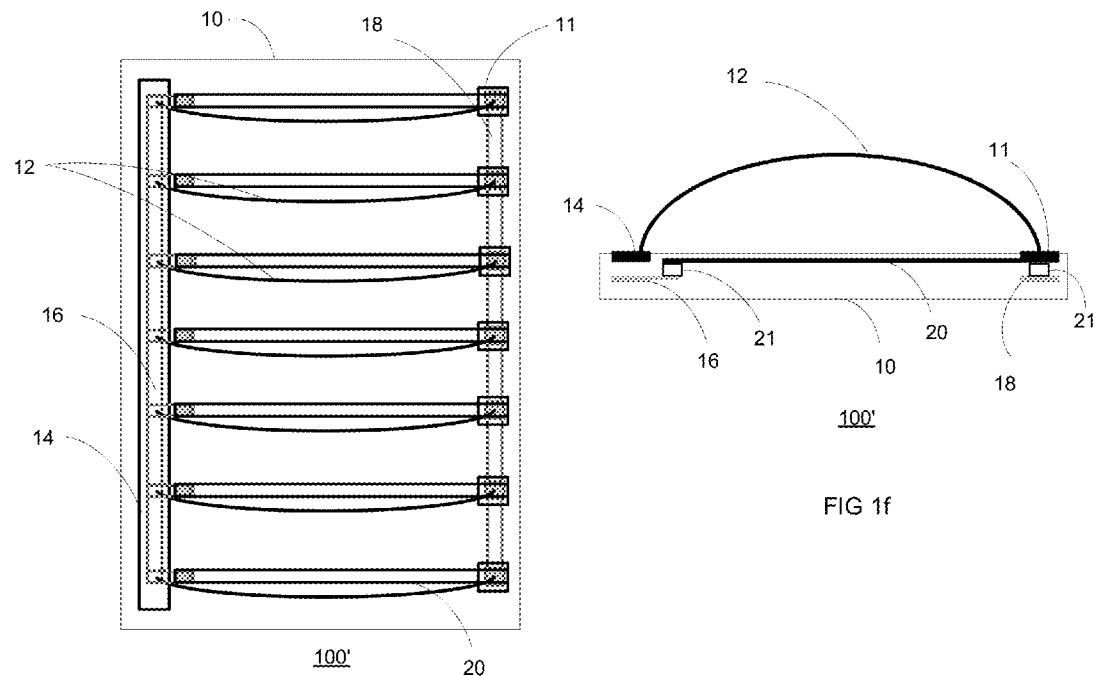
FIG 1e
FIG 1f
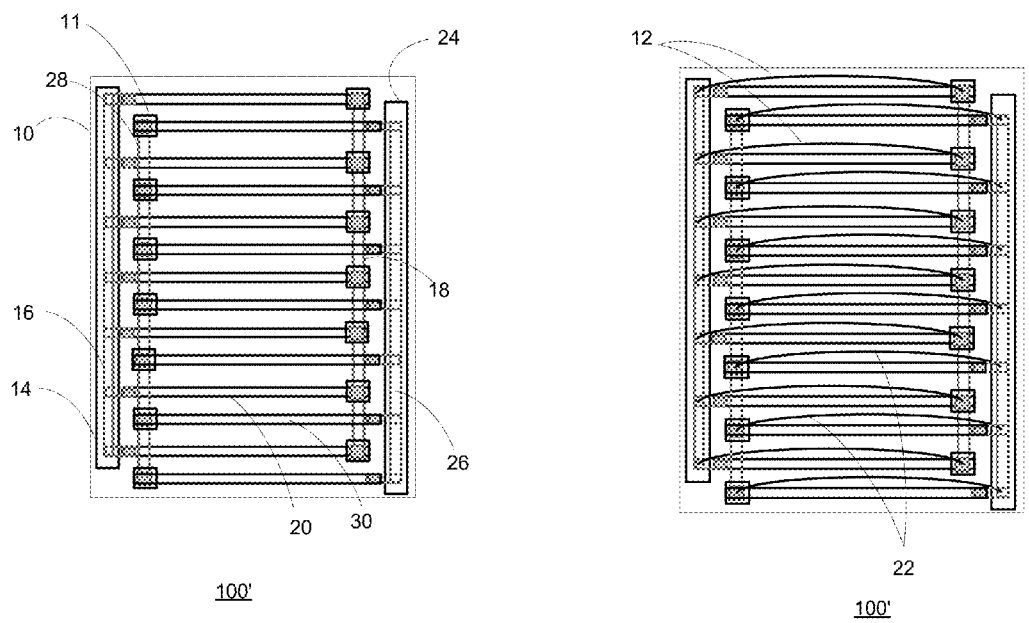
FIG 2a
FIG 2b

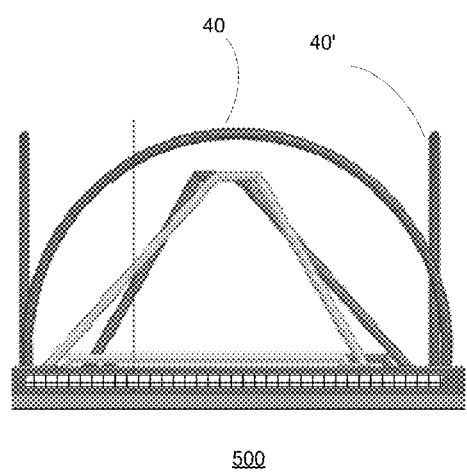
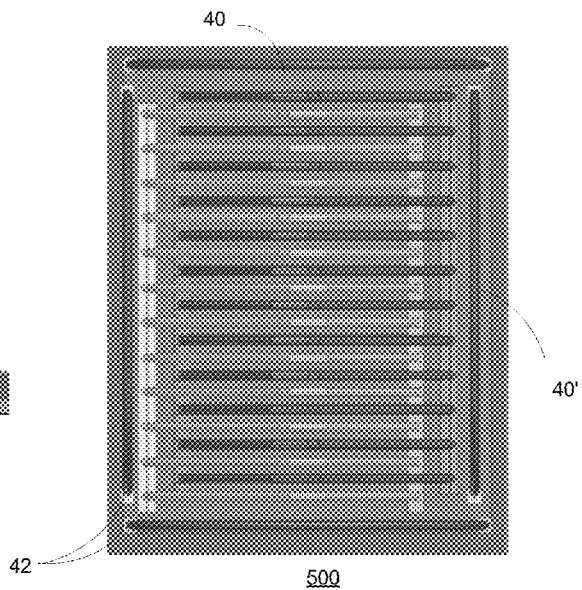
FIG 6a  FIG 6b
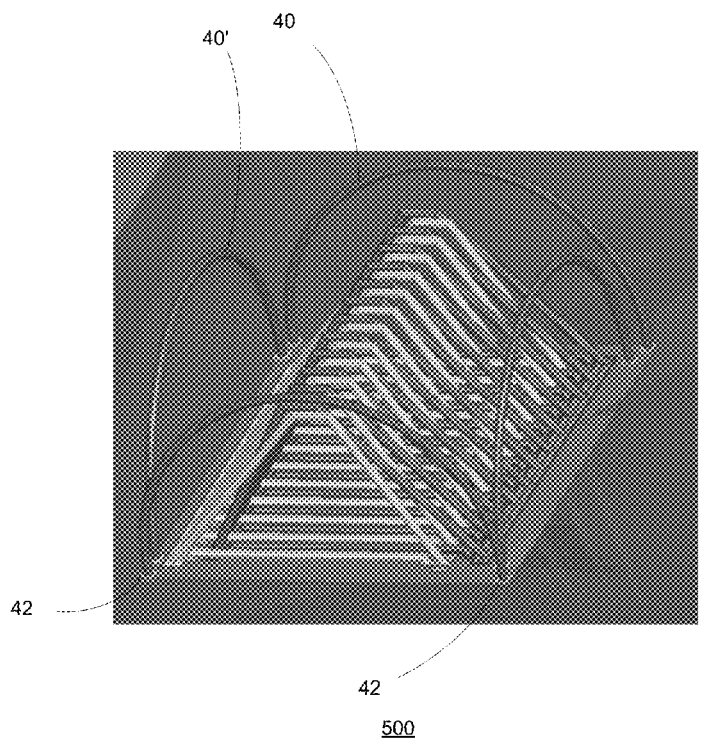
FIG 6c

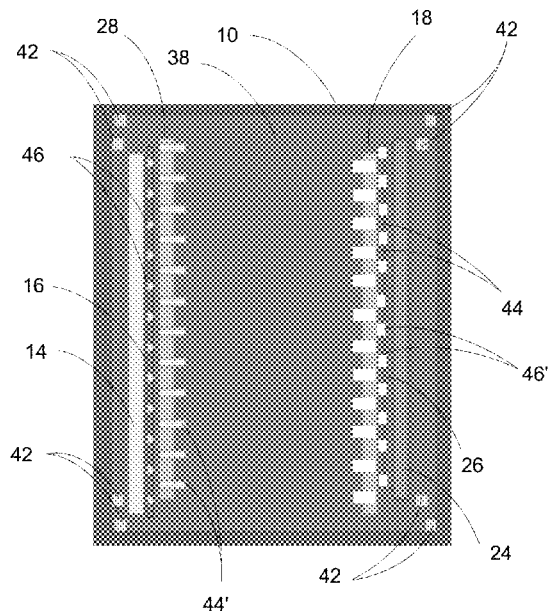
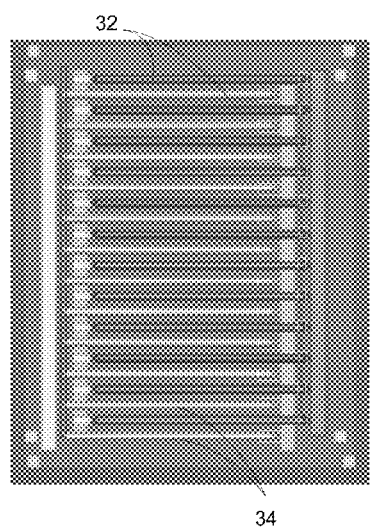
FIG 7a  FIG 7b
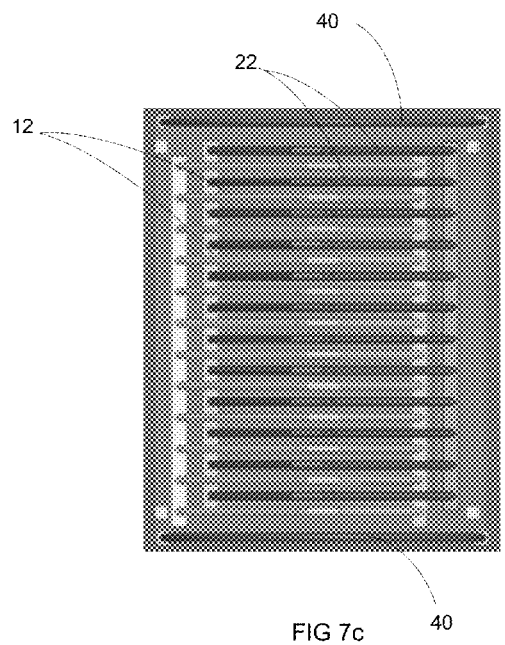
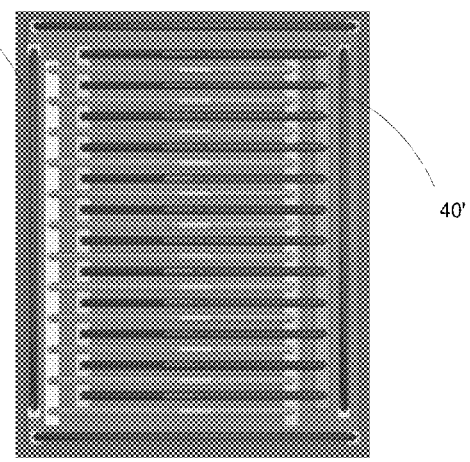
FIG 7c  FIG 7d

600

No capacitors

TRANSFORMER

CROSS-REFERENCE TO RELATED APPLICATIONS

This application claims the priority under 35 U.S.C. § 119 of European patent application no. 14182574.5, filed Aug. 28, 2014 the contents of which are incorporated by reference herein.

FIELD OF INVENTION

This invention relates to bond-wire transformers for radio-frequency (RF) devices.

BACKGROUND

Bond-wire Transformers are commonly used in a variety of RF circuits in Power RF amplifiers, such as Outphasing, Chireix, and Doherty amplifiers.

FIGS. 1a-1f show different views of a known bond-wire transformer 100. FIG. 1a shows the plan view of bond-wire transformer 100, FIG. 1b shows a 3 dimensional view, FIG. 1c shows a cross-section view, FIG. 1d illustrates the schematic equivalent circuit, and FIG. 1e illustrates the primary circuit 100' of the bond-wire transformer 100 in plan-view, figure if shows the primary circuit 100' of the bond-wire transformer in cross section 100. Bond-wire transformer 100 includes a substrate 10, which is typically a semiconductor die. A primary inductor, indicated as L1 in the schematic equivalent circuit may be formed by one or more primary bond-wires 12 and primary on-die transmission lines 20. One end of the primary bond-wire 12 is connected to a first primary terminal 14. The other end of each primary bond-wire 12 is connected to a bond pad 11 which is connected to a primary common bonding line 18 using an inter-metal via 21 as illustrated in FIG. 1f. One end of a primary on-die transmission line 20 may be connected to the primary common bonding line 18. The other end of the primary on-die transmission line is connected to a second primary terminal 16. Consequently each of the primary bond-wires 12 and a respective one of the primary on-die transmission lines 20 are electrically connected in series between the first primary terminal 14 and the second primary terminal 16 and form a loop. Pairs of primary bond-wires 12 and the respective primary on-die transmission lines 20 are electrically connected in parallel between the first primary terminal 14 and the second primary terminal 16.

A secondary inductor, indicated as L2 in the schematic equivalent circuit may be formed by one or more secondary bond-wires 22 and secondary on-die transmission lines 30. One end of the secondary bond-wire 22 is connected to a first secondary terminal 24. The other end of each secondary bond-wire 22 is connected to a secondary common bonding line 28. One end of a secondary on-die transmission line 30 may be connected to the secondary common bonding line 28. The other end of the secondary on-die transmission line is connected to a second secondary terminal 26. Consequently each of the secondary bond-wires 22 and a respective one of the secondary on-die transmission lines 30 are electrically connected in series between the first secondary terminal 24 and the second secondary terminal 26 and form a loop. Pairs of secondary bond-wires 22 and the respective secondary on-die transmission lines 30 are electrically connected in parallel between the first secondary terminal 24 and the second secondary terminal 26.

The sets of primary and secondary bond-wires 12, 22 and on-die transmission lines 20, 30 are inter-digitated. In this configuration, the bond-wires provide the magnetic coupling, while the on-die lines are provided to close the loop.

FIGS. 2a and 2b illustrate the steps for manufacturing the bond-wire transistor 100". As shown in FIG. 2a, the on-die metal interconnects are formed on substrate 10 using one or more metal layers during the fabrication of the semiconductor device. The first primary terminal 14, the primary on-die transmission line 20, the first secondary terminal 24, and the secondary on-chip transmission line 30 may be formed on a top metal layer and dimensioned such that a bond-wire can be directly attached. The second primary terminal 16, the primary common bonding line 18, second secondary terminal 26, and the secondary common bonding line 28 are formed on a lower metal layer. Inter layer vias (not shown) are used to make the connections between primary on-chip transmission line 20 and the primary common bonding line 18, the primary on-chip transmission line 20 and the second primary terminal 16, the secondary on-chip transmission line 30 and the secondary common bonding line 28 and the secondary on-chip transmission line 30 and the second secondary terminal 26. The bond-wires to form the primary and secondary inductors may be placed and attached with a conventional wire-bonding machine during packaging and assembly of the semiconductor device.

The bond-wire transformer 100 may provide better performance compared to on-die coupled inductors. However, the bond-wire transformer efficiency is still affected for example by Eddy currents induced in the substrate, particularly for low-ohmic substrates which may be used for Laterally Diffused Metal-Oxide-Semiconductor (LDMOS) devices and inefficient coupling between the bond-wires.

The result of these losses may be a drop in efficiency; loss in power; and increased operating temperature; if the transformer is used at the input, loss in gain. These losses may limit the use of bond-wire transformers in high power applications ranging from 1 to 100 Watts.

SUMMARY OF INVENTION

Various aspects of the invention are defined in the accompanying claims. In a first aspect there is defined a bond-wire transformer for an RF circuit comprising a substrate having a pair of primary terminals and a pair of secondary terminals, a primary circuit comprising at least one primary loop, the at least one primary loop comprising a pair of primary bond-wires electrically coupled in series between the pair of primary terminals, the first of the pair of primary bond-wires having a different maximum spacing from a major surface of the substrate than the second of the pair of primary bond-wires, and a secondary circuit comprising at least one secondary loop, the at least one secondary loop comprising a pair of secondary bond-wires electrically coupled in series between the pair of secondary terminals, the first of the pair of secondary bond-wires having a different maximum spacing from a major surface of the substrate than the second of the pair of secondary bond-wires.

The bond-wire transformer may increase the maximum current and consequently power that the transformer can handle, since bond-wires may have a higher current carrying capacity than on-chip transmission lines. Furthermore since there is less contact between the primary inductor loops formed by each pair of bond-wires and the substrate, the Eddy currents induced in the substrate may be reduced.

In embodiments the primary circuit further comprises a plurality of primary loops electrically coupled in parallel between the pair of primary terminals, and the secondary circuit further comprises a plurality of secondary loops electrically coupled in parallel between the pair of secondary terminals.

In embodiments the primary circuit further comprises a plurality of primary loops electrically coupled in series between the pair of primary terminals, and the secondary circuit further comprises a plurality of secondary loops electrically coupled in series between the pair of secondary terminals.

Each primary loop is electrically coupled in series between the terminals. However multiple primary loops may be electrically coupled in parallel or series between the primary and secondary terminal Each secondary loop is electrically coupled in series between the terminals. However multiple secondary loops may be electrically coupled in parallel or series between the secondary terminals.

In embodiments the primary loops of the bond-wire transformer may be located inter-digitated with each of the secondary loops.

The bond-wire transformer may be formed from multiple primary loops aligned in parallel and alternating with secondary loops for improved magnetic coupling between primary and secondary circuits.

In embodiments of the bond-wire transformer the substrate may comprise a plurality of metal layers and a shield layer, the shield layer comprising a region of one of the plurality of metal layers, wherein the shield layer is operably coupled to a ground potential.

Placing a ground shield beneath the bond-wires may further prevent the magnetic field inducing Eddy currents into the substrate;

In embodiments, the bond-wire transformer may further comprise at least one guard bond-wire arranged between an edge of the substrate and the at least one primary and secondary loops, wherein each end of the at least one guard bond-wire is operably coupled to a ground potential.

In embodiments at least one end of the at least one guard bond-wire is connected to a first plate of a capacitor and a further plate of the capacitor is operably coupled to a ground potential.

The guard bond-wires loops connected to ground directly can be used to from a "guard ring" or, optionally, via grounded capacitors. The guard rings at the edges of the transformers act as magnetic walls providing confinement of the magnetic field.

Embodiments may comprise a plurality of guard bond-wires arranged in series between an edge of the substrate and the at least one primary and secondary loops, and wherein each end of each of the plurality of guard bond-wires is operably coupled to a ground potential.

Embodiments may comprise a plurality of guard bond-wires arranged along each edge of the substrate, wherein each end of the plurality of guard bond-wires is operably coupled to a ground potential.

Embodiments of the bond-wire transformer may be incorporated in a packaged RF device such as a Doherty Amplifier, or a Chireix amplifier. The RF device may be implemented using CMOS technology.

In a second aspect there is provided method of manufacturing a bond-wire transformer, comprising providing a substrate having a pair of primary terminals, a pair of secondary terminals, a primary common bonding line, and a secondary common bonding line; providing a pair of primary bond-wires arranged to form a primary loop of a primary circuit of the bond-wire transformer and a pair of secondary bond-wires arranged to form a secondary loop of a secondary circuit of the bond-wire transformer by the steps of: connecting a first of a pair of primary bond-wires between a first of a pair of primary terminals and the primary common bonding line; connecting a first of a pair of secondary bond-wires between one of the pair of primary terminals and the secondary common bonding line; connecting a second of the pair of primary bond-wires between a second of the pair of primary terminals and the primary common bonding line; connecting a second of the pair secondary bond-wires between a second of a pair of primary terminals and the secondary common bonding line; and wherein the first of the pair of primary bond-wires have a different maximum spacing from a major surface of the substrate than the second of the pair of primary bond-wires, and the first of the pair of secondary bond-wires having a different maximum spacing from a major surface of the substrate than the second of the pair of secondary bond-wires.

The bond-wire transformer may be manufactured without specialized technology or additional back-end fabrication steps and so does not lead to any significant increase of fabrication costs.

Embodiments of the method of manufacturing the bond-wire transformer may comprise connecting each end of at least one guard bond-wire to the substrate such that each end of the at least one guard bond-wire is operably coupled to a ground connection, and arranging the guard bond-wire between an edge of the substrate and the primary and secondary loops.

Embodiments of the method of manufacturing the bond-wire transformer may comprise providing at least one capacitor on the substrate having a first plate connected to at least one end of the at least one guard bond-wire and a further plate operably coupled to a ground connection.

Embodiments of the method of manufacturing the bond-wire transformer may comprise providing a metal region configured as a shield layer in one of the metal layers in the substrate, wherein the shield layer is operably connected to a ground connection.

BRIEF DESCRIPTION OF THE DRAWINGS

In the figures and description like reference numerals refer to like features. Embodiments of the invention are now described in detail, by way of example only, illustrated by the accompanying drawings in which:

FIGS. 1a to 1f show a known bond-wire transformer.

FIGS. 2a to 2b illustrate steps for manufacturing a known bond-wire transformer.

FIGS. 6a to 6c show a bond-wire transformer with a guard ring according to a further embodiment.

FIGS. 7a to 7d show the steps for manufacturing embodiments of the bond-wire transformer.

DESCRIPTION

Figure 3A:
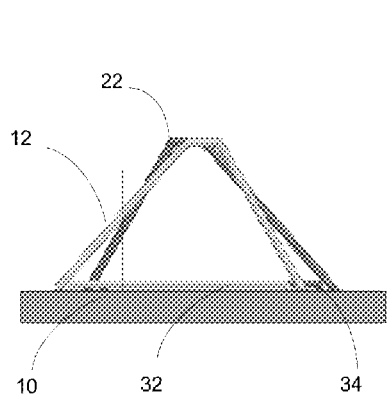
FIGS. 3a to 3d Illustrate a bond-wire transformer according to an embodiment.
Figure 3B:
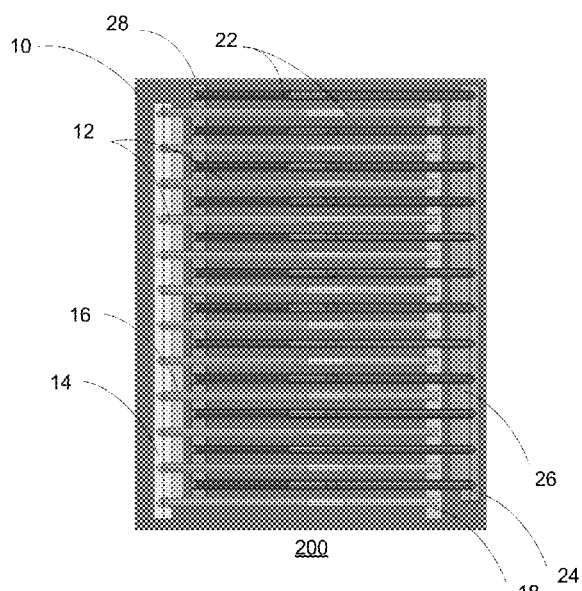
Figure 3C:
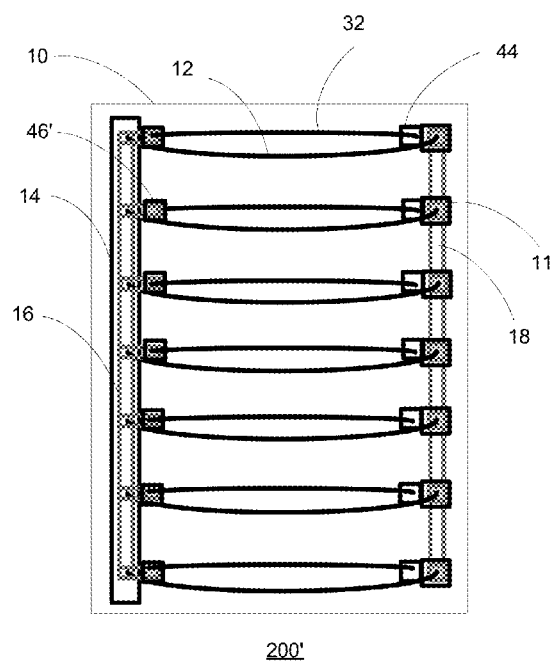
Figure 3D:
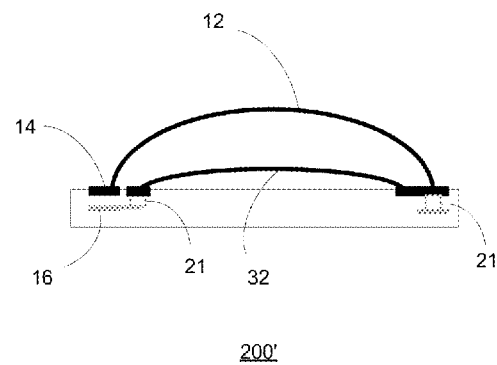

FIGS. 3a to 3d illustrates an embodiment of a bond-wire transformer 200. FIG. 3a illustrates the bond-wire transformer in cross-section or profile FIG. 3b illustrates the plan view. FIG. 3c shows an example of the primary circuit of bond-wire transformer 200' in plan-view and FIG. 3d shows the cross section of the primary circuit of bond-wire transformer 200'.

Bond-wire transformer 200 includes a substrate 10, which is typically a semiconductor die. A primary inductor may be formed by one or more primary bond-wires 12 and one or more low profile primary bond-wires 32. One end of the primary bond-wire 12 may be connected to a first primary terminal 14. The other end of each primary bond-wire 12 may be connected to a primary common bonding line 18. One end of a low profile primary bond-wire 32 may be connected to bond pad 44 which may connect to the primary common bonding line 18 using an inter metal layer via 21. The other end of the low profile primary bond-wire 32 may be connected to a bond pad 46 which may connect to a second primary terminal 16 using an inter metal layer via. Consequently each of the primary bond-wires 12 and a respective one of the low profile primary bond-wires 32 are electrically connected in series between the first primary terminal 14 and the second primary terminal 16 and may form a primary loop of a primary circuit. A primary circuit having multiple primary loops may be formed from primary bond-wires 12 and the respective low profile primary bond-wires 32 electrically connected in parallel between the first primary terminal 14 and the second primary terminal 16.

A secondary inductor may be formed by one or more secondary bond-wires 22 and one or more low profile secondary bond-wires 34. One end of the low profile secondary bond-wire 34 may be connected to a first secondary terminal 24. The other end of each secondary bond-wire 22 may be connected to a secondary common bonding line 28. One end of a secondary low profile bond-wire 34 may be connected to the secondary common bonding line 28. The other end of the low profile secondary bond-wires 34 may be connected to one or more bond pads (not shown) which may connect to a second secondary terminal 26. Consequently each of the secondary bond-wires 22 and a respective one of the low profile secondary bond-wires 34 are electrically connected in series between the first secondary terminal 24 and the second secondary terminal 26 and may form a secondary loop. Multiple secondary loops formed from secondary bond-wires 22 and the respective secondary on-die transmission lines 30 are electrically connected in parallel between the first secondary terminal 24 and the second secondary terminal 26.

The term low-profile bond-wire may be considered to be a bond-wire that when viewed in profile has a maximum gap or distance from a major surface of the substrate of less than either a primary bond-wire 12 or secondary bond-wire 22. The maximum gap between the substrate and a low profile bond-wire may be in the range 50 microns and 100 micron. The maximum height of the low profile bond-wire may be less than 150 microns. The maximum height of the low-profile bond-wire may be less than 15% of the maximum height of a primary bond-wire 12 or secondary bond-wire 22.

The primary and secondary loops formed from the bond-wires may be arranged so that in operation there is a mutual inductance between the loops. A primary inductor may be formed from a single primary loop and a secondary inductor may be formed from a single secondary loop. Typically the primary inductor or primary circuit will be formed from multiple primary loops and the secondary inductor or secondary circuit will be formed from multiple secondary loops. The primary and secondary loops are typically arranged to be inter-digitated as shown for example in FIG. 3b such that there is a mutual inductance induced between the primary and secondary inductor in operation.

By replacing on chip transmission lines with low-profile bond-wires, the current carrying capacity of the transformer may be increased. Since the low profile bond-wires 32, 34 have the same cross-section as the primary and secondary bond-wires 12, 22 they do not limiting factors for electrical losses and maximum current/power. The low profile of the bond-wires maximizes the area of the primary and secondary loops, thus causing no reduction the coupling factor. The increased current handling capabilities make the transformer suitable for applications such as microwave, RF heating and RF lighting where a high level of ruggedness is required. Furthermore since the bond-wire only contacts with the substrate 10 at each end the eddy currents induced in the substrate may be reduced.

Figure 4:
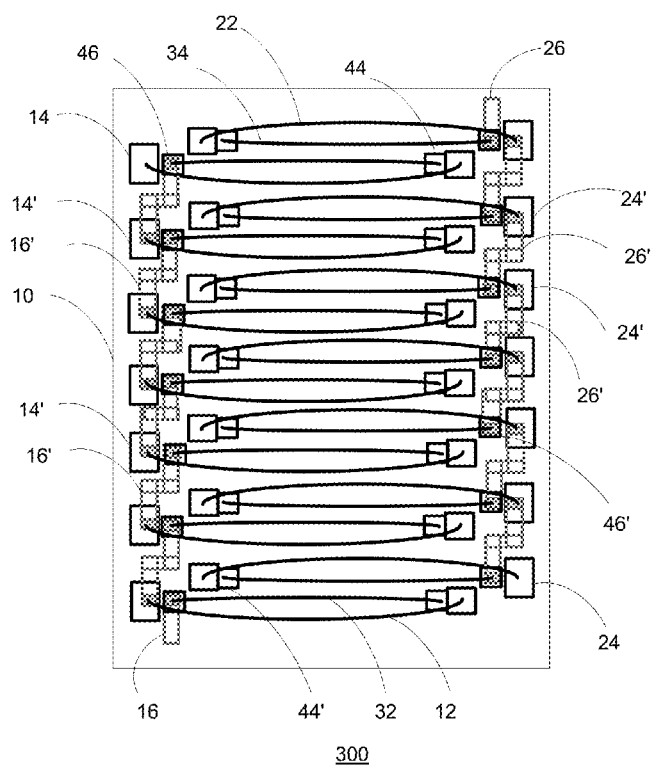
FIG. 4 show a further bond-wire transformer according to an embodiment.

FIG. 4 shows bond-wire transformer 300. Bond-wire transformer 300 includes a substrate 10, which is typically a semiconductor die. A primary inductor may be formed by one or more primary loops, each primary loop having a pair of bond-wires consisting of a primary bond-wire 12 and low profile primary bond-wire 32. One end of the primary bond-wire 12 may be connected to a first primary terminal 14, 14' which may be a bond pad. The other end of each primary bond-wire 12 may be connected to a bond pad 44. One end of a low profile primary bond-wire 32 may be connected to the bond pad 44. The other end of the low profile primary bond-wire 32 may be connected to a bond pad 46 which may connect to a second primary terminal 16,16' using an inter metal layer via (not shown). Pairs of primary bond-wires may be electrically connected in series by connecting the primary terminal 14' of each of the pair of primary bond-wires to the secondary terminal 16' of another pair of primary bond-wires. Consequently the primary bond-wires 12 and the low profile primary bond-wires 32 are electrically connected in series between the first primary terminal 14 and the second primary terminal 16 and may form a primary loop as part of a primary circuit of the bond-wire transformer 300.

A secondary inductor may be formed by one or more pairs of bond-wires, each pair of bond-wires consisting of a secondary bond-wire 22, and a low profile secondary bond-wire 34. One end of the secondary bond-wire 22 may be connected to a first secondary terminal 24, 24' which may be a bond pad. The other end of each secondary bond-wire 12 may be connected to a bond pad 44'. One end of a low profile secondary bond-wire 32 may be connected to the bond pad 44'. The other end of the low profile secondary bond-wire 32 may be connected to a bond pad 46' which may connect to a second secondary terminal 26,26' using an inter metal layer via (not shown). Pairs of secondary bond-wires may be electrically connected in series by connecting the first secondary terminal 24' of each of the pair of secondary bond-wires to the second secondary terminal 26' of another pair of secondary bond-wires. Consequently the secondary bond-wires 12 and the low profile secondary bond-wires 32 are electrically connected in series between the first secondary terminal 24 and the second secondary terminal 26 and may form a secondary inductor or a secondary circuit.

Pairs of primary bond-wires may be located in parallel with each other and are inter-digitated with pairs of secondary bond-wires. In the plan view of FIG. 4, each of the pairs of bond-wires is not shown in the same vertical plane. However, each of a respective pair of bond-wires runs substantially in a common vertical plane perpendicular to a major surface of the substrate.

Figures 5A, 5B:
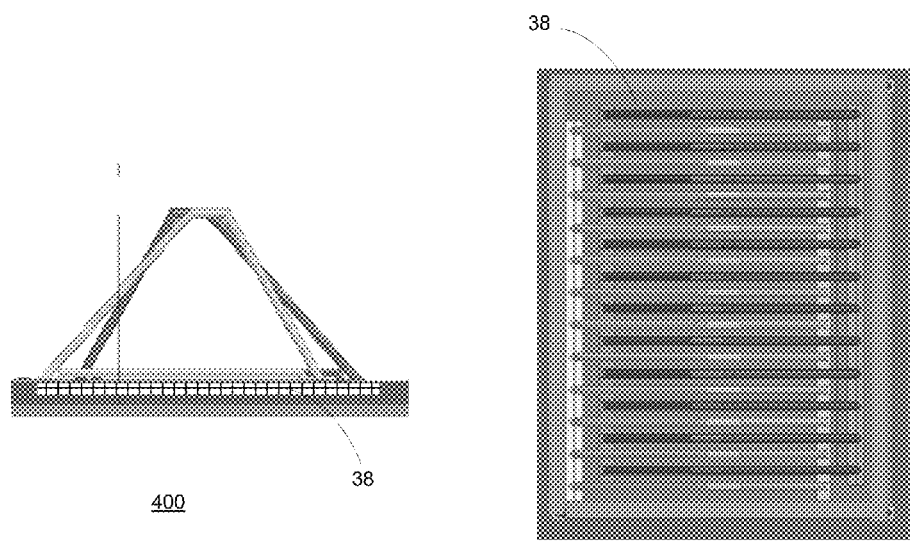
FIGS. 5a and 5b show a bond-wire transformer with shield layer according to an embodiment.

FIG. 5 shows an embodiment of the bond-wire transformer 400. FIG. 5a shows the bond-wire transformer in cross-section. FIG. 5b shows the bond-wire transformer in plan-view. The bond-wire transformer 400 differs from bond-wire transformer 200 in that is has a shield layer 38 formed in the substrate 10. Typically the substrate 10 will be a semiconductor device such as an LDMOS device and so the shield layer 38 will be formed from using one of the metal layers available during the normal processing of the semiconductor. The shield layer 38 may be patterned or continuous depending on what other interconnections are required. In operation, the shield layer may be connected to a ground potential. The shield layer further isolates the substrate 10 from the magnetic field and may reduce Eddy currents in the substrate, so limiting the losses. Because the primary inductor and the secondary inductor are formed using bond-wires only and do not use on-chip transmission lines, the metal shield does not result in any significant decrease in the inductance of the wire loops and so does not need to be patterned. Having a continuous shield area further reduces the Eddy currents compared to a patterned shield. FIG. 6 illustrates a bond-wire transformer 500. FIG. 6a shows the profile or cross section view 500. FIG. 6b shows the plan view of bond-wire transformer 500.

FIG. 6c shows a 3 dimensional view of bond-wire transformer 500. Bond-wire transformer 500 differs from bond-wire transformer 400 in that it has additional guard bond-wires 40, 40' arranged around the edges of the substrate 10. Bond-wire transformer, 500 may have a single bond-wire arranged parallel to each side of the substrate 10 and between one of the edges of the substrate and the bond-wires forming the primary and secondary circuits of the bond-wire transformer 500. The ends of each of the guard bond-wires 40, 40' maybe connected to bond pads which form one plate of capacitor 42. The other plate of capacitor 42 may be formed using a lower metal layer within the substrate 10. The other plate of capacitor 42 may be connected to a ground potential in operation. The capacitors 42 may have a capacitance in the range of 1-10 picoFarads. In some embodiments, the capacitors 42 may be omitted and the ends of each of the guard bond-wires 40, 40' may be connected directly to a ground potential in operation. The guard bond-wires 40, 40' may act as a guard ring around the primary inductor and the secondary inductor to provide a confinement of the magnetic field. In embodiments one or more of the guard bond-wires 40, 40' may be omitted, but that will reduce the effectiveness of the magnetic confinement.

FIG. 7 shows a method of manufacturing bond-wire transformer 500. The skilled person will appreciate that some of the steps illustrated may be wholly or partially omitted to form bond-wire transformer 300 or bond-wire transformer 400. FIG. 6a shows the substrate 10 after front end processing has been completed using a semiconductor process such as a CMOS process. This may be a semiconductor device formed using a CMOS process such as an LDMOS process. In addition to the active transistors or other semiconductor devices formed on the substrate 10, the metallization layers available in the CMOS process may be used to form primary common bonding line 18, first secondary terminal 24, second secondary terminal 26, first primary terminal 14, second primary terminal 16, secondary common bonding line 28, shield layer 38, capacitors 42, common bonding line bond pads 44, 44', primary and secondary terminal bond pads 46', 46. In this example, the top-level metal layer, that is to say the metal layer to which the bond-wires are connected, may be denoted layer N. The next lowest metal layer may be denoted layer N−1. Top plates of capacitors 42, common bonding line bond pads 44, 44', primary and secondary terminal bond pads 46, 46', first primary terminal 14, first secondary terminal 24, may be formed using metal layer N. Second primary terminal 16, primary common bonding line 18, second secondary terminal 26, secondary common bonding line 28, and second plate of capacitor 42, may be formed using metal layer N−1. A connection between the second primary terminal 16 and primary terminal bond pads 46 may be made using into metal layer vias (not shown). A connection between the second secondary terminal 26 and secondary terminal bond pads 46 made using metal vias (not shown). A connection between the primary common bonding line 18 and common bonding line bonding pads 44 may be made using metal layer vias (not shown). A connection between the secondary common bonding line 28 and common bonding line bonding pads 44' may be made using metal vias (not shown). The shield layer 38 may be formed using a metal layer N−2. In alternative embodiments, different metallization layers may be used as appropriate to achieve the required connectivity between the circuit elements. For example having the shield at a higher metal level, for example N−1, N, may be further minimize losses due to eddy current, since higher metal layers in CMOS processing steps are normally thicker.

In the step shown in FIG. 7b the low-profile primary bond-wires 32, and the low-profile secondary bond-wires 34 may be connected to the substrate 10 using a wire bonding machine. One end of each of the low-profile primary bond-wires 32 may be connected to one of the common bonding line bond pads 44. The other end of each of the low-profile primary bond-wires 32 may be connected to one of the secondary terminal bond pads 46. One end of each of the low-profile secondary bond-wires 34 may be connected to one of the common bonding line bond pads 44'. The other end of each of the low-profile secondary bond-wires 34 may be connected to one of the second secondary terminal bond pads 46'.

In FIG. 7c transformer bond-wires 12, 22 and the longitudinal guard rings bond-wires 40, may be placed with a wire bonding machine. Primary bond-wires 12, and secondary bond-wires 22, may be routed directly over the respective low-profile primary bond-wires 32 and low-profile secondary bond-wires 34 without making direct contact. One end of each of the primary bond-wires 12 may be connected to first primary terminal 14. The other end of each of the primary bond-wires 12 may be connected to one of the common bonding line bond pads 44 connected to primary common bonding line 18. One end of each of the secondary bond-wires may be connected to first secondary terminal 24. The other end of each of the secondary bond-wires 22 may be connected to one of the common bonding line bond pads 44' connected to secondary bonding line 28. Each end of the longitudinal guard ring bond-wires 40 may be connected to a respective first plate of a respective capacitor 42. In FIG. 6D, the transversal guard ring bond-wire's 40' may be placed with a wire bonding machine. Each end of the transversal guard ring bond-wires 40' may be connected to the respective first plate of the respective capacitor 42.

The method illustrated in FIG. 7 results in a bond-wire transformer 500 which can be manufactured without additional specialist equipment and using existing processing steps. The bond-wire transformer 500 may be implemented in various package technologies, such as ceramic or plastic overmould packages (OMP).

Alternative embodiments may include a full metal case which encloses the bond-wire transformer to improve magnetic confinement. However, the metal walls of such metal casing may need to be less than a few millimeters in dimensions with a thickness of less than 100 micrometers. The metal case would be placed on-chip and connected to ground. Thus, dedicated ground contacts need to be first placed on chip during the back-end processing and the case would then need to be precisely aligned with the contacts formed during the front-end processing. This would increase fabrication costs.

Moreover, a metal case is incompatible with plastic overmould packages (OMPs), which typically have a lower cost than ceramic packages. This is because, during the packaging process, the plastic compound would not be able to flow into the cavity of the metal case; consequently, air and moisture would remain trapped into the metal case cavity increasing the chances of package failure.

While FIG. 7 illustrates the manufacture of bond-wire transformer 500, the skilled person will appreciate that modification of the steps shown in FIG. 6 may be used to make other embodiments. For example the bond-wire transformer 300 may be made by omitting the shield layer 38 and the capacitors 42 and guard bond-wires 40, 40'. The bond-wire transformer 400 may be made by omitting guard bond-wires 40, 40'. The skilled person will appreciate that the bond-wire transformer 300 illustrated in FIG. 4 may be fabricated with similar steps to those described in FIG. 7.

Figure 8A:
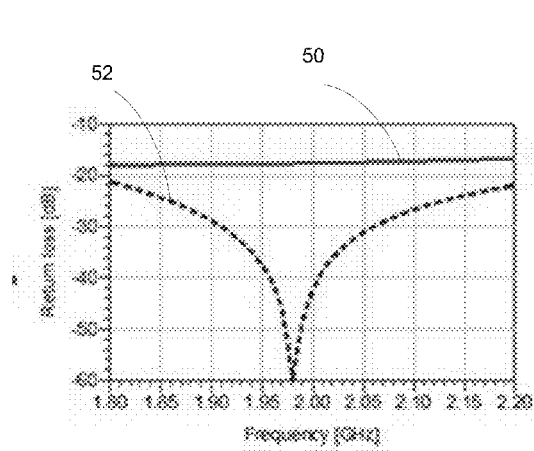
FIGS. 8a to 8e are graphs to illustrate the difference in performance between the embodiment illustrated in FIG. 6 and a known bond-wire transformer.

FIG. 8a shows a graph plotting the return loss in decibels on the y-axis against frequency and gigahertz on the X axis. The y-axis varies between −60 dB is and −10 dB is and the X axis varies between 1.8 GHz and 2.2 GHz. Graph line 50 shows the variation of return loss for the known bond-wire transformer 100. Graph line 50 varies between the value of approximately −18 dB is at a frequency of 1.8 years to a return loss of approximately −16 dB is at a frequency of 2.2 GHz. Graph line 52 shows the variation of return loss with frequency for the bond-wire transformer 500. Graph line 52 shows a maximum return loss of approximately −22 dB is in the frequency range of 1.8 GHz to 2.2 GHz, with a minimum return loss of −60 dB at a frequency of 1.9 GHz. The return loss for bond-wire transformer 500 is lower than for bond-wire transformer 100 between 1.8 GHz and 2.2 GHz and significantly lower at a frequency of 1.98 GHz.

Figure 8B:
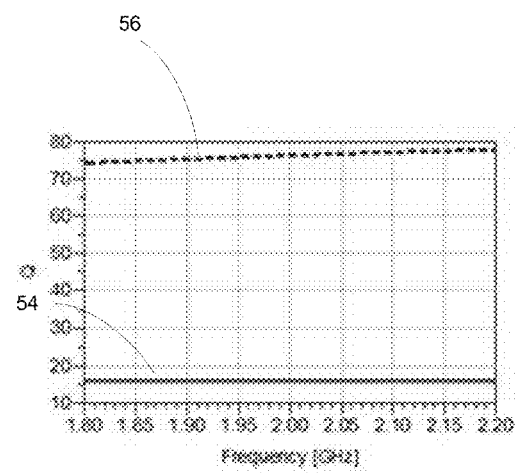

FIG. 8b shows a graph of the variation of Q factor on the y-axis against the frequency in gigahertz on the X axis for bond-wire transformer 500 and the known bond-wire transformer 100. The Q factor on the y-axis varies between 10 and 80. The frequency on the x axis varies between 1.8 GHz and 2.2 GHz. Line 56 shows the variation of Q factor for bond-wire transformer 500. The Q factor for bond-wire transformer 500 varies between the value of approximately 75 at 1.8 GHz to a value of approximately 79 at 2.2 GHz. Line 54 shows the variation of Q factor for the known bond where transformer 100. Graph line 54 varies between a Q factor of approximately 18 at 1.8 GHz to a value of approximately 19 at 2.2 GHz. The graph 7B clearly illustrates that the bond-wire transformer 500 has a significantly higher Q factor than the known bond-wire transformer 100.

Figure 8C:
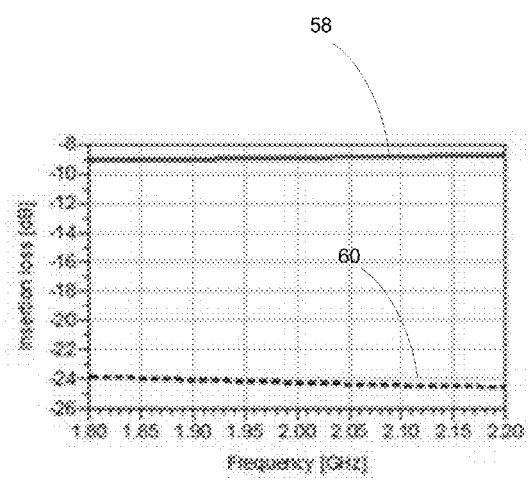

FIG. 8c shows a graph of insertion loss in decibel is on the y-axis plotted against frequency in gigahertz on the X axis. The y-axis varies between a value of −26 to −8 dB. The X axis varies between a frequency of 1.8 GHz to 2.2 GHz. Graph line 58 illustrates the variation of insertion loss for the known bond-wire transformer 100. Graph line 58 varies between a value of approximately −9 dB at 1.8 GHz to a value of −8.5 dB at 2.2 GHz. Graph line 60 illustrates the variation of insertion loss for the bond-wire transformer 500. Graph line 60 varies between a value of approximately −24 dB at a frequency of 1.8 GHz to a value of approximately −24.5 dB is at a frequency of 2.2 GHz. FIG. 8c clearly illustrates that the insertion loss for bond-wire transformer 500 is significantly better than the insertion loss for the known bond-wire transformer 100.

Figure 8D:
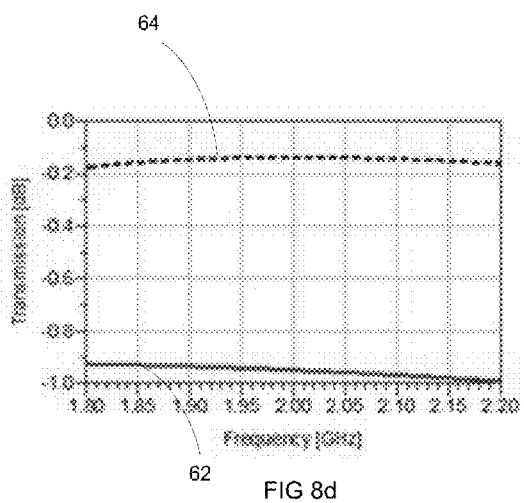

FIG. 8d illustrates a graph of the transmission in decibels plotted on the y-axis against frequency in gigahertz potted on the X axis. Graph line 62 illustrates the variation of the transmission with frequency for the known bond-wire transformer 100. Graph line 62 varies between a value of approximately −0.92 dB is at a frequency of 1.8 GHz to a value of approximately −1 dB at a frequency of 2.2 GHz. Graph line 64 illustrates the variation of transmission with frequency for the bond-wire transformer 500. Graph line 64 varies between the value of approximately −0.19 dB to −0.15 dB over the frequency range of 1.8 GHz to 2.2 GHz. The maximum value of −0.15 dB is occurs at a frequency of the approximately 2 GHz. FIG. 8d clearly illustrates that the transmission in decibels for bond-wire transformer 500 is significantly improved compared with the known bond-wire transformer 100.

Figure 8E:
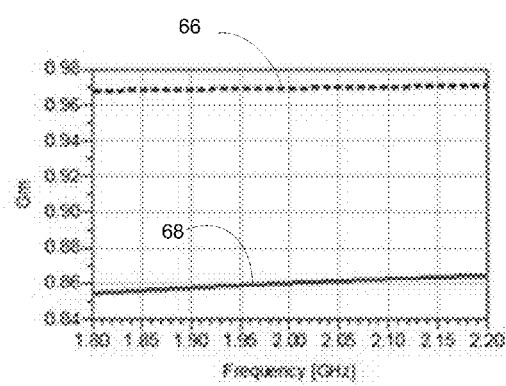

FIG. 8e illustrates a graph of the transconductance Gm plotted on the y-axis against frequency in gigahertz potted on the X axis. Graph line 68 illustrates the variation of the transmission with frequency for the known bond-wire transformer 100. Graph line 68 varies between a value of approximately 0.85 at a frequency of 1.8 GHz to a value of approximately 0.86 at a frequency of 2.2 GHz. Graph line 66 illustrates the variation of transmission with frequency for the bond-wire transformer 500. Graph line 66 has a constant value of approximately 0.97 in the range of 1.8 GHz to 2.2 GHz.

Figure 9A:
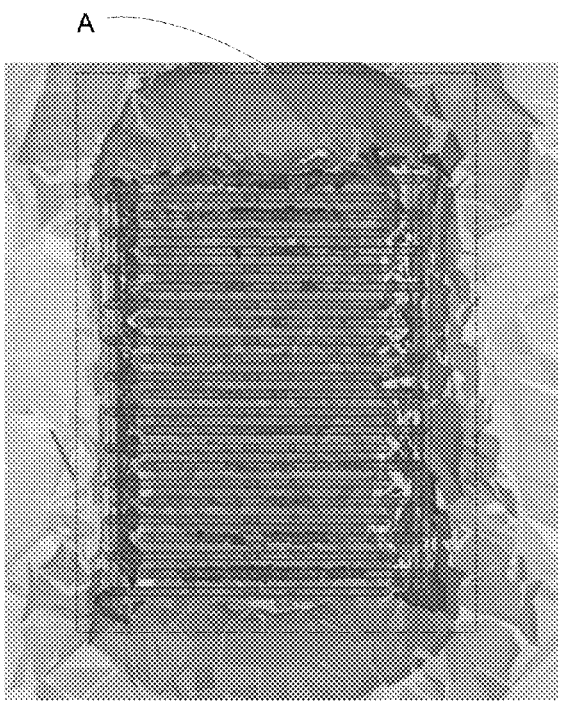
FIGS. 9a and 9b illustrate the difference in eddy currents induced in the substrate between the bond-wire transformer of FIGS. 1a to 1f and the embodiment illustrated in FIGS. 5a and 5b.
Figure 9B:
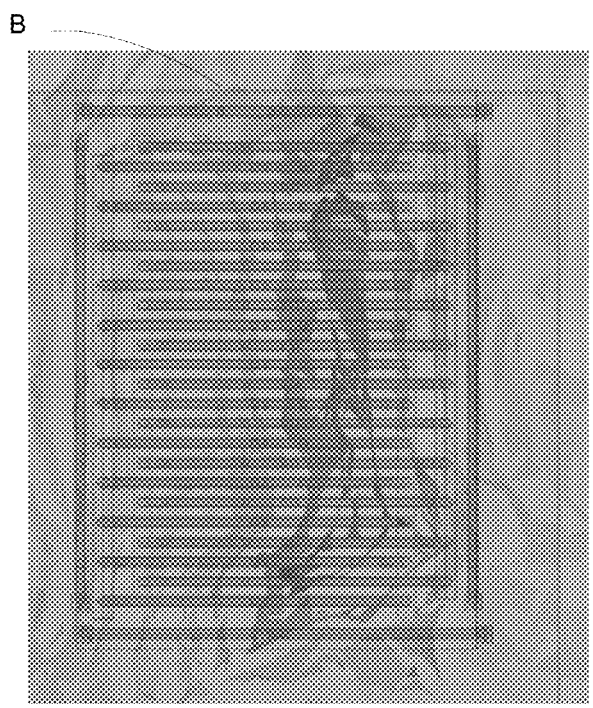
Figure 10A:
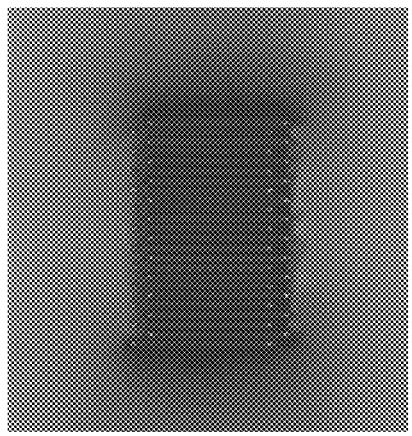
FIGS. 10a to 10d show the difference in magnetic field confinement between the bond-wire transformer of FIG. 1 and the embodiment illustrated in FIGS. 6a to 6c.
Figure 10B:
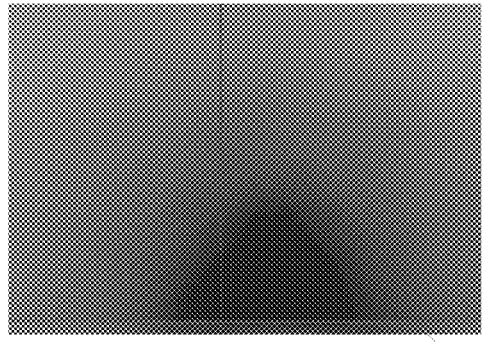
Figure 10C:
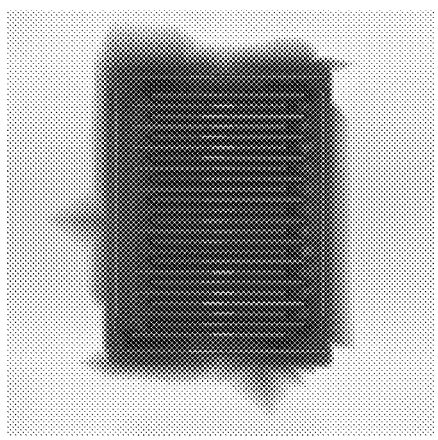
Figure 10D:
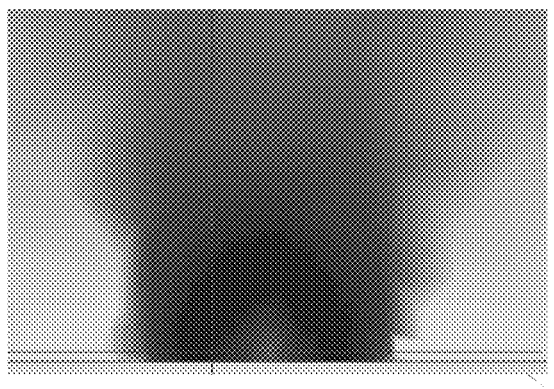

FIG. 9 illustrates the substrate loss in bond-wire transformers. FIG. 9a shows the substrate loss in known bond-wire transformer 100. FIG. 9b illustrates the substrate loss in bond-wire transformer 500 having a shield layer 38. The darker shades indicate stronger fields in the substrate due to eddy currents and therefore higher losses. The area indicated as region A in FIG. 9a is darker than the area indicated in region B shown in FIG. 9b. This clearly indicates the beneficial effect of including the metal shield 38 in the bond-wire transformer 500.

FIG. 10 illustrates a comparison of the magnetic field confinement in bond-wire transformer 100 and bond-wire transformer 500. FIG. 10a shows the plan view of the magnetic field distribution in bond-wire transformer 100. FIG. 10b shows the cross-sectional view of the magnetic field distribution in bond-wire transformer 100. FIG. 10c illustrates the plan view of the magnetic field distribution in bond-wire transformer 500. Darker areas indicate stronger field values, while lighter areas indicate weaker field values. Typical maximum values, for example for a monolithic microwave integrated circuit (MMIC) application are in the order of a few thousands A/m inside the transformer. FIG. 10 shows the cross-sectional view of the magnetic field distribution and bond-wire transformer 500. The magnetic field is largely confined by the guard bond-wires 40, 40'. Compared to the traditional bond-wire transformer 100, the magnetic field is low in the substrate due to the shield layer 38. The confinement of the magnetic field may lead to a reduction of the transformer loss resulting in improved efficiency, since more of the energy is transferred from the primary circuit to the secondary circuit.

Figure 11A:
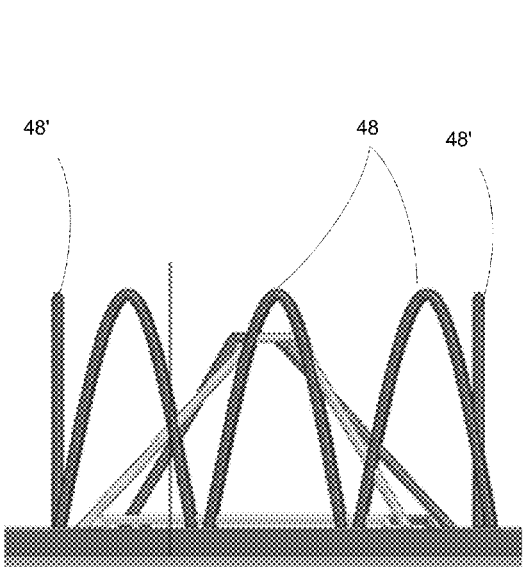
FIGS. 11a and 11b show a bond-wire transformer with multi-section guard ring according to an embodiment.
Figure 11B:
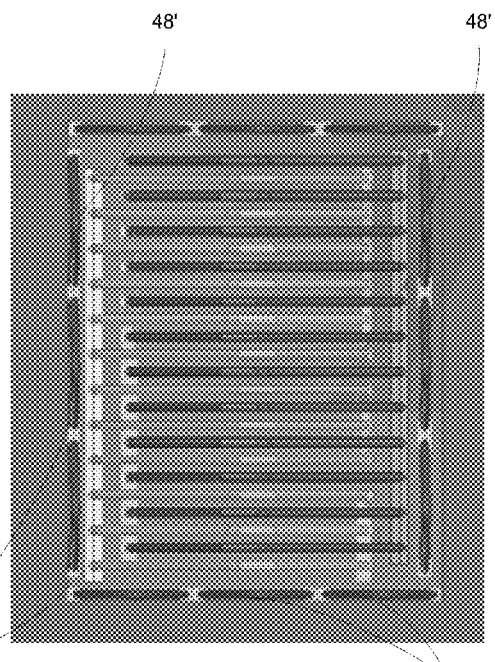

FIG. 11 shows bond-wire transformer 600. FIG. 11*a* shows a cross-section view, and FIG. 11*b* shows a family. The bond-wire transformer 600 differs from the example bond-wire transformer 500 illustrated in FIG. 6 in that it has multi-section guard bond-wires 48, 48', that is to say there are multiple guard bond-wires along each edge of the substrate 10. Each end of each of the multi-section guard bond-wires 48, 48' may be connected to a respective capacitor 42. In the example shown in FIG. 11, bond-wire transformer 600 has three sections on each side of the transformer, but alternative embodiments may have more or fewer sections.

Figure 12A:
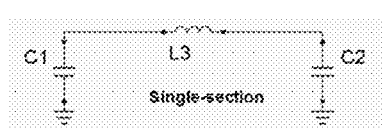
FIGS. 12a to 12c illustrate the difference in effective impedance between the multi-section guard ring of the embodiment shown in FIGS. 10a to 10d and the single-section guard ring shown in the embodiment of FIGS. 6a to 6c.
Figure 12B:
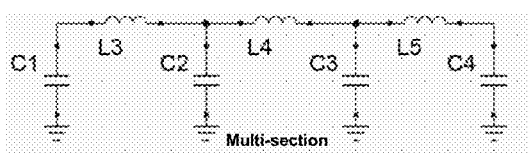
Figure 12C:
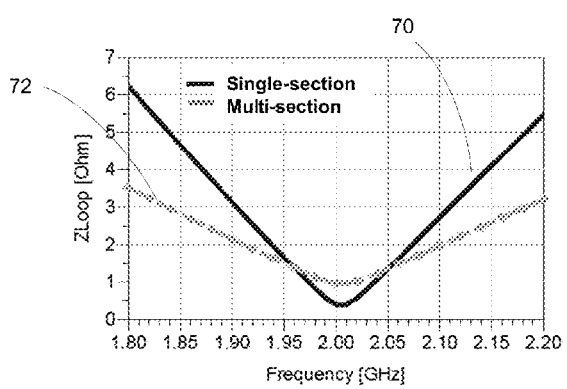

In operation, the guard ring formed by the multi-section guard bond-wires 48, 48' may have reduced loop impedance over a wider frequency band. This is illustrated in FIG. 12. FIG. 12*a* shows an equivalent circuit of a single section guard bond-wire which is equivalent to the arrangement guard bond-wires 40, 40' along one edge of bond-wire transformer 500. A first capacitance C1 may be coupled between one end of an inductor L3, representing a guard bond-wire 40, and ground. A second capacitance C2 may be coupled between the other end of an inductance L3 and ground. FIG. 12*b* shows a three-section equivalent circuit, which is equivalent to the arrangement of guard bond-wires 48, 48' shown along one edge of bond-wire transformer 600. Three guard bond-wires 48 may be represented by a series arrangement three inductance is L3, L4 and L5. Capacitors 42 represented by capacitance is C1, C2, C3, C4. Each end of the inductance is L3, L4 and L5 may be coupled to ground via a capacitance. FIG. 12*c* shows a graph of the variation of the loop impedance plotted on the y-axis against frequency in gigahertz plotted on the X axis. The single section guard bond-wire arrangement of bond-wire transformer 500 is plotted on graph line 70 and shows a variation of loop impedance between approximately 6 ohms at a frequency of 1.8 GHz reducing to a minimum value of approximately 0.5 ohms at a frequency of 2 GHz and increasing to a value of approximately 5.5 ohms at 2.2 GHz. The three-section guard bond-wire arrangement of bond-wire transformer 600 is plotted on graph line 72 and shows a variation of loop impedance between approximately 3.5 ohms at 1.8 GHz, reducing to 1 ohm at 2 GHz, and then increasing to approximately 3 ohms at 2.2 GHz.

Figure 13A:
FIGS. 13a and 13b show the effect of including ground capacitors to embodiments of the bond-wire transformers including guard rings.
Figure 13B:
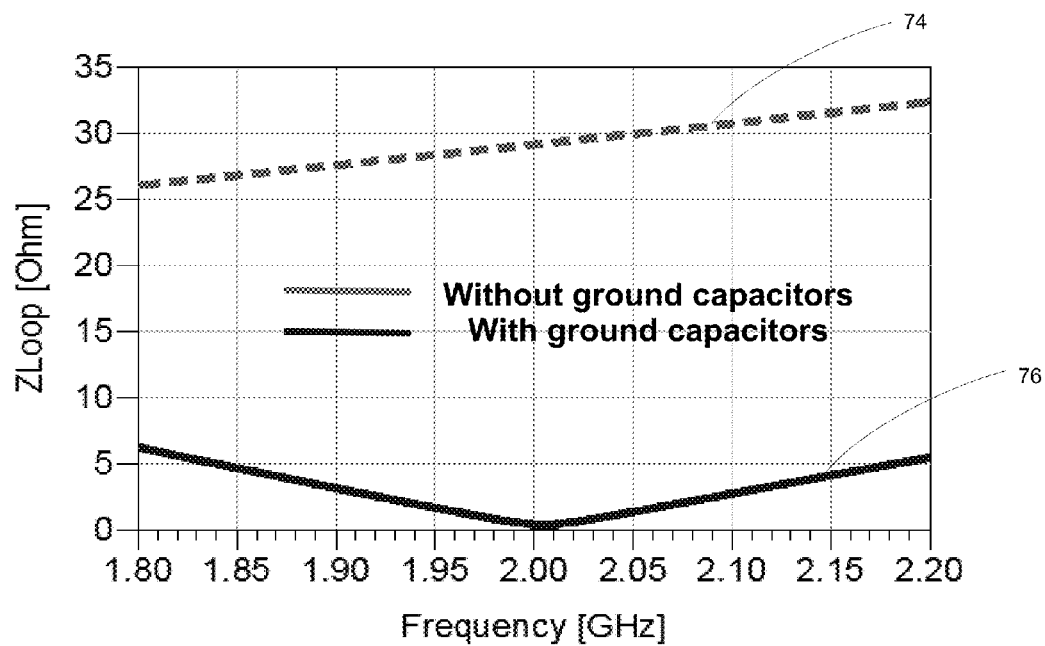

FIG. 13 shows the effect on the loop impedance of connecting guard bond-wires 40, 40' directly to ground rather than via a capacitor. The equivalent circuit in the case of no capacitors being used is shown in FIG. 13*a* which consists of a single inductance L3 with each side directly coupled to ground. FIG. 13*b* shows the graph of loop impedance plotted on the y-axis against frequency in gigahertz plotted on the X axis. Graph line 74 shows the impedance variation of the guard bond-wire 40 without capacitors. The loop impedance is considerably higher starting at around 25 ohms at a frequency of 1.8 GHz and rising to approximately 32 ohms at a frequency of 2.2 GHz. Graph line 76 shows the variation of impedance with capacitance coupled to both sides of the bond-wire. Graph line 76 shows a variation of loop impedance between approximately 6 ohms at a frequency of 1.8 GHz reducing to a minimum value of approximately 0.5 ohms at a frequency of 2 GHz and increasing to a value of approximately 5.5 ohms at 2.2 GHz.

Although the appended claims are directed to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A bond-wire transformer for an RF circuit comprising:
a substrate being a semiconductor die comprising a plurality of metal layers including a top-level metal layer (N) and a next lowest metal layer (N−1), which substrate has a pair of primary terminals and a pair of secondary terminals, wherein a region of one of the plurality of metal layers is defined as a shield layer, wherein the shield layer is operably coupled to a ground potential,
a primary circuit comprising primary bond-wires electrically coupled in series between the pair of primary terminals, a first of the primary bond-wires having a different maximum spacing from a major surface of the substrate than a second of the primary bondwires, and
a secondary circuit comprising secondary bond-wires electrically coupled in series between the pair of secondary terminals, a first of the secondary bond-wires having a different maximum spacing from a major surface of the substrate than a second of the secondary bond-wires,
wherein the first terminal of said pairs of terminals is defined in the top-level metal layer (N) and the second terminal of said pairs of terminals is defined in the next lowest metal layer (N−1),
wherein the primary circuit comprises at least one primary loop having a pair of primary bond-wires, each pair consisting of a first and a second primary bond-wire, which first primary bond-wire is routed directly over the second primary bond wire without making direct contact, wherein the secondary circuit comprises at least one secondary loop having a pair of secondary bond-wires, each pair consisting of a first and a second secondary bond-wire, which first secondary bond-wire is routed directly over the second secondary bond wire without making direct contact.

2. The bond-wire transformer of claim 1 wherein the primary circuit comprises a plurality of primary loops electrically coupled in parallel between the pair of primary terminals, and the secondary circuit comprises a plurality of secondary loops electrically coupled in parallel between the pair of secondary terminals.

3. The bond-wire transformer of claim 1 wherein the primary circuit comprises a plurality of primary loops electrically coupled in series between the pair of primary terminals, and the secondary circuit comprises a plurality of secondary loops electrically coupled in series between the pair of secondary terminals.

4. The bond-wire transformer of claim 2 wherein the plurality of primary loops are inter-digitated with the plurality of secondary loops.

5. The bond-wire transformer of claim 1 further comprising at least one guard bond-wire arranged between an edge of the substrate and the at least one primary and secondary loops, wherein each end of the at least one guard bond-wire is operably coupled to a ground potential.

6. The bond-wire transformer of claim 5 wherein at least one end of the at least one guard bond-wire is connected to a first plate of a capacitor and wherein a further plate of the capacitor is operably coupled to a ground potential.

7. The bond-wire transformer of claim 5 comprising a plurality of guard bond-wires arranged in series between an edge of the substrate and the at least one primary and secondary loops, and wherein each end of each of the plurality of guard bond-wires is operably coupled to a ground potential.

8. The bond-wire transformer of claim 1 comprising a plurality of guard bond-wires arranged along each edge of the substrate, wherein each end of the plurality of guard bond-wires is operably coupled to a ground potential.

9. A packaged RF device comprising the bond-wire transformer of claim 1.

10. The packaged RF device of claim 9 configured as one of a Doherty Amplifier and a Chireix amplifier.

11. A method of manufacturing a bond-wire transformer, comprising:
providing a substrate being a semiconductor die comprising a plurality of metal layers including a top-level metal layer (N) and a next lowest metal layer (N−1), which substrate has a pair of primary terminals, a pair of secondary terminals, a primary common bonding line, and a secondary common bonding line, wherein a region of one of the plurality of metal layers is defined as a shield layer, wherein the shield layer is operably coupled to a ground potential, wherein the first terminal of said pairs of terminals is defined in the top-level metal layer (N) and the second terminal of said pairs of terminals is defined in the next lowest metal layer (N−1) and wherein the primary and secondary common bonding line are defined in the next lowest metal layer (N−1);
providing a pair of primary bond-wires arranged to form a primary loop of a primary circuit of the bond-wire transformer and a pair of secondary bond-wires arranged to form a secondary loop of a secondary circuit of the bond-wire transformer by the steps of:
connecting a first of a pair of primary bond-wires between a first of a pair of primary terminals and the primary common bonding line;
connecting a first of a pair of secondary bond-wires between one of the pair of secondary terminals and the secondary common bonding line;
connecting a second of the pair of primary bond-wires between a second of the pair of primary terminals and the primary common bonding line;
connecting a second of the pair of secondary bond-wires between a second of a pair of secondary terminals and the secondary common bonding line; and
wherein the first of the pair of primary bond-wires has a different maximum spacing from a major surface of the substrate than the second of the pair of primary bond-wires, and the first of the pair of secondary bond-wires has a different maximum spacing from a major surface of the substrate than the second of the pair of secondary bond-wires, and
the first of the pairs of primary and secondary bond-wires is routed directly over the respective second of the pairs of the primary and secondary bond-wires without making direct contact.

12. The method of claim 11 further comprising:
connecting each end of at least one guard bond-wire to the substrate such that each end of the at least one guard bond-wire is operably coupled to a ground connection, and arranging the at least one guard bond-wire between an edge of the substrate and the primary and secondary loops.

13. The method of claim 12 wherein the substrate comprises at least one capacitor having a first plate and a further plate operably coupled to a ground connection, and wherein at least one end of the at least one guard bond wire is connected to the first plate of the capacitor, wherein the first plate of the capacitor is defined in the top-level metal layer (N) of the semiconductor die.

14. The bond-wire transformer of claim 2 wherein
one end of the first primary bond-wire is connected to the first primary terminal and the other end of each primary bond-wire is connected to a primary bonding line,
one end of the second primary bond-wire is connected to a bond pad connected to the primary common bonding line using an inter metal layer via, and the other end of said second primary bond-wire is connected to a bond pad connected to the secondary primary terminal using an inter metal layer via, and
one end of the first secondary bond-wire is connected to the first secondary terminal and the other end of each primary bond-wire is connected to a secondary bonding line,
one end of the second secondary bond wire is connected to the second secondary bonding line, and the other end of the second secondary bond wire is connected to a bond pad connecting to the second secondary terminal.

15. The bond-wire transformer of claim 5, wherein bond pads for connecting the guard wires constitute the first plate of said capacitor, wherein the capacitors (42) preferably having a capacitance in the range of 1-10 pF.

* * * * *